US009029771B2

(12) United States Patent
Uedaira et al.

(10) Patent No.: US 9,029,771 B2
(45) Date of Patent: May 12, 2015

(54) SEMICONDUCTOR DEVICE AND ELECTRONIC APPARATUS EMPLOYING THE SAME

(75) Inventors: Yoshitsugu Uedaira, Kyoto (JP); Yuichiro Nakata, Kyoto (JP); Junji Fujino, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 195 days.

(21) Appl. No.: 13/574,301

(22) PCT Filed: Dec. 20, 2010

(86) PCT No.: PCT/JP2010/072862
§ 371 (c)(1),
(2), (4) Date: Jul. 20, 2012

(87) PCT Pub. No.: WO2011/092968
PCT Pub. Date: Aug. 4, 2011

(65) Prior Publication Data
US 2012/0286162 A1 Nov. 15, 2012

(30) Foreign Application Priority Data
Jan. 26, 2010 (JP) .................... 2010-014445

(51) Int. Cl.
*G01J 5/20* (2006.01)
*H01L 27/14* (2006.01)
*H01L 31/00* (2006.01)
*G06F 3/03* (2006.01)
*G01S 17/02* (2006.01)

(52) U.S. Cl.
CPC ............. *G06F 3/0304* (2013.01); *G01S 17/026* (2013.01); *G06F 2203/0339* (2013.01)

(58) Field of Classification Search
USPC ....................................... 250/338.4
See application file for complete search history.

(56) References Cited

U.S. PATENT DOCUMENTS 3,572,949 A * 3/1971 Rouet .......................... 356/434
5,808,224 A * 9/1998 Kato ............................... 84/609
(Continued)

FOREIGN PATENT DOCUMENTS

JP        01-153759 U      10/1989
JP        10148640      *   2/1998
(Continued)

OTHER PUBLICATIONS

International Search Report for PCT/JP2010/072862 dated Feb. 22, 2011.
Japanese Patent Office, communication in patent appln. No. 2010-014445 (dated Mar. 25, 2014) (and English translation).

*Primary Examiner* — David Porta
*Assistant Examiner* — Abra Fein
(74) *Attorney, Agent, or Firm* — Fish & Richardson P.C.

(57) ABSTRACT

Disclosed is a semiconductor device, comprising a driver that causes first through third infrared LEDs to emit light sequentially at prescribed times; an infrared light sensor that receives infrared light that is emitted by the first through the third infrared LEDs and reflected by a reflecting object, and generates photoelectric currents at levels corresponding to the intensity of the received infrared light; an amplifier that generates first through third infrared light information, on the basis of the photoelectric current that is generated by the infrared light sensor, and which denote the intensity of the infrared light; an A/D converter; and a linear/logarithmic converter apparatus. It is thus possible to sense the movement of the reflecting object on the basis of the first through the third infrared light information.

19 Claims, 18 Drawing Sheets

(56) References Cited

U.S. PATENT DOCUMENTS

| | | |
|---|---|---|
| 6,369,794 B1 | 4/2002 | Sakurai et al. |
| 2006/0151678 A1 | 7/2006 | Shibata |
| 2006/0203401 A1* | 9/2006 | Kojori et al. ............... 361/42 |
| 2008/0054163 A1* | 3/2008 | Suzunaga ............. 250/214 A |
| 2008/0186262 A1* | 8/2008 | Lee .............................. 345/82 |
| 2008/0265185 A1* | 10/2008 | Numano ................... 250/551 |

FOREIGN PATENT DOCUMENTS

| | | |
|---|---|---|
| JP | 11-044703 | 2/1999 |
| JP | 2000-78262 | 3/2000 |
| JP | 2000-148351 | 5/2000 |
| JP | 2001-069235 | 3/2001 |
| JP | 3240941 B2 | 12/2001 |
| JP | 2004-159028 | 6/2004 |
| JP | 2006-194612 | 7/2006 |

* cited by examiner

FIG.2
(a) WHEN AN ADDRESS OF DATA REGISTER 20 IS DESIGNATED
(b) WHEN DATA IS WRITTEN DESIGNATING AN ADDRESS OF DATA REGISTER 20
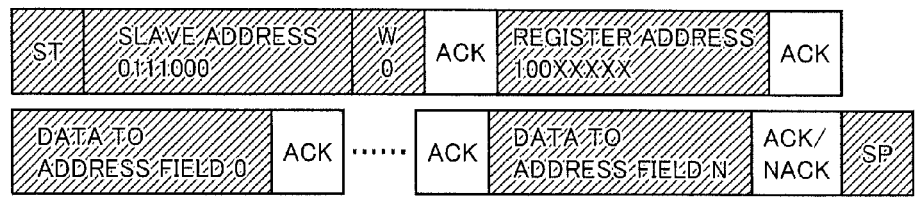
(c) WHEN DATA IS READ DESIGNATING AN ADDRESS OF DATA REGISTER 20
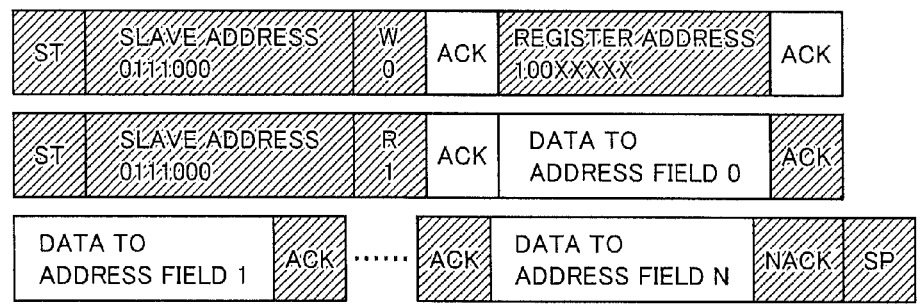
(d) WHEN DATA IS READ FROM DATA REGISTER 20
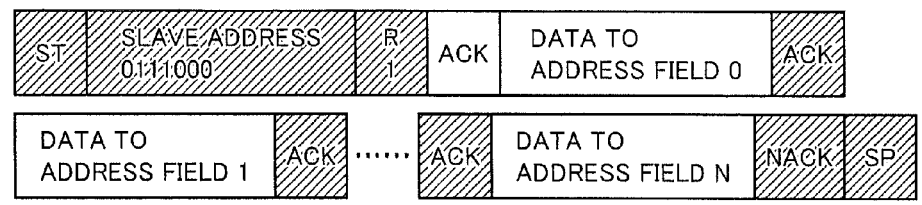

FIG.3

| ADDRESS | TYPE | REGISTER NAME | REGISTER FUNCTION |
|---|---|---|---|
| 80h | RW | ALS_CONTROL | ALS OPERATION MODE CONTROL, SW RESET |
| 81h | RW | PS_CONTROL | PS OPERATION MODE CONTROL |
| 82h | RW | I_LED | SELECTION OF TO-BE-ACTIVATED LED, CURRENT SETTING OF LEDs 31, 32 |
| 83h | RW | I_LED33 | CURRENT SETTING OF LED 33 |
| 84h | RW | ALS_PS_MEAS | FORCED MODE TRIGGER |
| 85h | RW | PS_MEAS_RATE | PS MEASUREMENT RATE IN STAND ALONE MODE |
| 86h | RW | ALS_MEAS_RATE | ALS MEASUREMENT RATE IN STAND ALONE MODE |
| 8Ah | R | PART_ID | PART No. & REVISED ID |
| 8Bh | R | MANUFACT_ID | MANUFACTURER ID |
| 8Ch | R | ALS_DATA_0 | LOWER BYTE OF ALS DATA |
| 8Dh | R | ALS_DATA_1 | UPPER BYTE OF ALS DATA |
| 8Eh | R | ALS_PS_STATUS | MEASUREMENT DATA & INTERRUPT STATUS |
| 8Fh | R | PS_DATA_LED31 | PS DATA FROM LED 31 |
| 90h | R | PS_DATA_LED32 | PS DATA FROM LED 32 |
| 91h | R | PS_DATA_LED33 | PS DATA FROM LED 33 |
| 92h | RW | INTERRUPT | INTERRUPT SETTING |
| 93h | RW | PS_TH_LED31 | PS INTERRUPT THRESHOLD VALUE FOR LED 31 |
| 94h | RW | PS_TH_LED32 | PS INTERRUPT THRESHOLD VALUE FOR LED 32 |
| 95h | RW | PS_TH_LED33 | PS INTERRUPT THRESHOLD VALUE FOR LED 33 |
| 96h | RW | ALS_TH_UP_0 | LOWER BYTE OF ALS UPPER THRESHOLD VALUE |
| 97h | RW | ALS_TH_UP_1 | UPPER BYTE OF ALS UPPER THRESHOLD VALUE |
| 98h | RW | ALS_TH_LOW_0 | LOWER BYTE OF ALS LOWER THRESHOLD VALUE |
| 99h | RW | ALS_TH_LOW_1 | UPPER BYTE OF ALS LOWER THRESHOLD VALUE |

FIG.4

REGISTER ALS_CONTROL (80h)

(a)

| 7 | 6 | 5 | 4 | 3 | 2 | 1 | 0 |
|---|---|---|---|---|---|---|---|
| RES | RES | RES | RES | RES | SW RESET | ALS MODE ||

INITIAL VALUE 00h (b)

| FIELD | BIT | TYPE | DESCRIPTION |
|---|---|---|---|
| RES | 7:3 | RW | WRITE 0000 |
| SW RESET | 2 | RW | 0: NOT TO START INITIAL RESET<br>1: TO START INITIAL RESET |
| ALS MODE | 1:0 | RW | 0X: STANDBY MODE<br>10: FORCED MODE<br>11: STAND ALONE MODE |

FIG.5

REGISTER PS_CONTROL (81h)

(a)

| 7 | 6 | 5 | 4 | 3 | 2 | 1 | 0 |
|---|---|---|---|---|---|---|---|
| X | X | X | X | X | X | PS MODE ||

INITIAL VALUE 00h (b)

| FIELD | BIT | TYPE | DESCRIPTION |
|---|---|---|---|
| NA | 7:2 | – | IGNORE |
| PS MODE | 1:0 | RW | 0X: STANDBY MODE<br>10: FORCED MODE<br>11: STAND ALONE MODE |

FIG.6

REGISTER I_LED (82h)

(a)
| 7 | 6 | 5 | 4 | 3 | 2 | 1 | 0 |
|---|---|---|---|---|---|---|---|
| PS ACTIVATION | | LED 2 CURRENT | | | LED 1 CURRENT | | |

INITIAL VALUE 1Bh (b)
| FIELD | BIT | TYPE | DESCRIPTION |
|---|---|---|---|
| PS ACTIVATION | 7:6 | RW | 00: ACTIVATE LED 31<br>01: ACTIVATE LEDs 31, 32<br>10: ACTIVATE LEDs 31, 33<br>11: ACTIVATE LEDs 31-33 |
| LED 32 CURRENT | 5:3 | RW | 000: 5mA<br>001: 10mA<br>010: 20mA<br>011: 50mA<br>100: 100mA<br>101: 150mA<br>11X: 200mA |
| LED 31 CURRENT | 2:0 | RW | |

FIG.7

REGISTER I_LED 33 (83h)

(a)

| 7 | 6 | 5 | 4 | 3 | 2 | 1 | 0 |
|---|---|---|---|---|---|---|---|
| X | X | X | X | X | \multicolumn{3}{c|}{LED 33 CURRENT} |

INITIAL VALUE 03h (b)

| FIELD | BIT | TYPE | DESCRIPTION |
|---|---|---|---|
| NA | 7:3 | – | IGNORE |
| LED 33 CURRENT | 2:0 | RW | 000:5mA<br>001:10mA<br>010:20mA<br>011:50mA<br>100:100mA<br>101:150mA<br>11X:200mA |

FIG.8

REGISTER ALS_PS_MEAS (84h)

(a)

| 7 | 6 | 5 | 4 | 3 | 2 | 1 | 0 |
|---|---|---|---|---|---|---|---|
| X | X | X | X | X | X | ALS TRIGGER | PS TRIGGER |

INITIAL VALUE 00h (b)

| FIELD | BIT | TYPE | DESCRIPTION |
|---|---|---|---|
| NA | 7:2 | – | IGNORE |
| ALS TRIGGER | 1 | RW | 0: NOT TO START NEW ALS MEASUREMENT<br>1: TO START NEW ALS MEASUREMENT |
| PS TRIGGER | 0 | RW | 0: NOT TO START NEW PS MEASUREMENT<br>1: TO START NEW PS MEASUREMENT |

FIG.9

REGISTER PS_MEAS_RATE (85h)

(a)

| 7 | 6 | 5 | 4 | 3 | 2 | 1 | 0 |
|---|---|---|---|---|---|---|---|
| X | X | X | X | PS MEASUREMENT RATE | | | |

INITIAL VALUE 05h (b)

| FIELD | BIT | TYPE | DESCRIPTION |
|---|---|---|---|
| NA | 7:4 | - | IGNORE |
| PS MEASUREMENT RATE | 3:0 | RW | 0000 : 10ms<br>0001 : 20ms<br>0010 : 30ms<br>0011 : 50ms<br>0100 : 70ms<br>0101 : 100ms<br>0110 : 200ms<br>0111 : 500ms<br>1000 : 1000ms<br>1001 : 2000ms<br>101X : 2000ms<br>11XX : 2000ms |

FIG.10

REGISTER ALS_PS_STATUS (8Eh)

(a)

| 7 | 6 | 5 | 4 | 3 | 2 | 1 | 0 |
|---|---|---|---|---|---|---|---|
| ALS INT STATUS | ALS DATA STATUS | LED33 INT STATUS | LED33 DATA STATUS | LED32 INT STATUS | LED32 DATA STATUS | LED31 INT STATUS | LED31 DATA STATUS |

INITIAL VALUE 00h (b)

| FIELD | BIT | TYPE | DESCRIPTION |
|---|---|---|---|
| ALS INT STATUS | 7 | R | 0: INACTIVATE SIGNAL INT<br>1: ACTIVATE SIGNAL INT |
| ALS DATA STATUS | 6 | R | 0: OLD DATA (ALREADY READ DATA)<br>1: NEW DATA (NOT-YET-READ DATA) |
| LED 33 INT STATUS | 5 | R | 0: INACTIVATE SIGNAL INT<br>1: ACTIVATE SIGNAL INT |
| LED 33 DATA STATUS | 4 | R | 0: OLD DATA (ALREADY READ DATA)<br>1: NEW DATA (NOT-YET-READ DATA) |
| LED 32 INT STATUS | 3 | R | 0: INACTIVATE SIGNAL INT<br>1: ACTIVATE SIGNAL INT |
| LED 32 DATA STATUS | 2 | R | 0: OLD DATA (ALREADY READ DATA)<br>1: NEW DATA (NOT-YET-READ DATA) |
| LED 31 INT STATUS | 1 | R | 0: INACTIVATE SIGNAL INT<br>1: ACTIVATE SIGNAL INT |
| LED 31 DATA STATUS | 0 | R | 0: OLD DATA (ALREADY READ DATA)<br>1: NEW DATA (NOT-YET-READ DATA) |

FIG.11

REGISTER PS_DATA_LED (8Fh, 90h, 91h)

(a)

| 7 | 6 | 5 | 4 | 3 | 2 | 1 | 0 |
|---|---|---|---|---|---|---|---|
| LED DATA | | | | | | | |

INITIAL VALUE 00h (b)

| REGISTER | ADDRESS | BIT | TYPE | DESCRIPTION |
|---|---|---|---|---|
| LED 1 DATA | 8Fh | 7:0 | R | PS MEASUREMENT DATA OF EACH LED |
| LED 2 DATA | 90h | 7:0 | R | |
| LED 3 DATA | 91h | 7:0 | R | |

FIG.12

REGISTER INTERRUPT (92h)

(a)

| 7 | 6 | 5 | 4 | 3 | 2 | 1 | 0 |
|---|---|---|---|---|---|---|---|
| X | INTERRUPT SOURCE | | X | OUTPUT MODE | INT POLARITY | INTERRUPT MODE | |

INITIAL VALUE 08h (b)

| FIELD | BIT | TYPE | DESCRIPTION |
|---|---|---|---|
| NA | 7 | - | IGNORE |
| INTERRUPT SOURCE | 6:5 | R | 00: INTERRUPT TRIGGERED BY ALS<br>01: INTERRUPT TRIGGERED BY LED 31<br>10: INTERRUPT TRIGGERED BY LED 32<br>11: INTERRUPT TRIGGERED BY LED 33 |
| NA | 4 | - | IGNORE |
| OUTPUT MODE | 3 | RW | 0: LATCH INT PIN UNTIL REGISTER INTERRUPT IS READ<br>1: UPDATE INT PIN AFTER EVERY MEASUREMENT |
| INT POLARITY | 2 | RW | 0: SET INT PIN TO LOGIC 0 IF SIGNAL INT IS ACTIVE<br>1: SET INT PINT TO LOGIC 1 IF SIGNAL INT IS INACTIVE |
| INTERRUPT MODE | 1:0 | RW | 00: INACTIVATE INT PIN (HIGH IMPEDANCE)<br>01: PS MEASUREMENT CAN BE TRIGGERED<br>10: ALS MEASUREMENT CAN BE TRIGGERED<br>11: PS AND ALS MEASUREMENTS CAN BE TRIGGERED |

FIG.13

REGISTER PS_TH_LED (93h, 94h, 95h)

(a)

| 7 | 6 | 5 | 4 | 3 | 2 | 1 | 0 |
|---|---|---|---|---|---|---|---|
| LED THRESHOLD VALUE | | | | | | | |

INITIAL VALUE FFh (b)

| REGISTER | ADDRESS | BIT | TYPE | DESCRIPTION |
|---|---|---|---|---|
| THRESHOLD VALUE OF LED 31 | 93h | 7:0 | RW | THRESHOLD VALUE FOR EACH LED |
| THRESHOLD VALUE OF LED 32 | 94h | 7:0 | RW | |
| THRESHOLD VALUE OF LED 33 | 95h | 7:0 | RW | |

FIG.14

REGISTER PS_DATA_LED31 (8Fh)

| 7 | 6 | 5 | 4 | 3 | 2 | 1 | 0 |
|---|---|---|---|---|---|---|---|
| 1 | 0 | 0 | 0 | 0 | 1 | 0 | 1 |

FIG.22
(a) LATERAL DIRECTION
    DETECTION
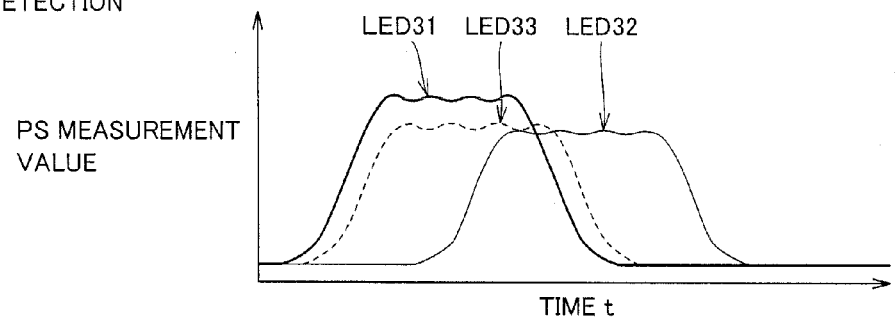
(b) LONGITUDINAL DIRECTION
    DETECTION
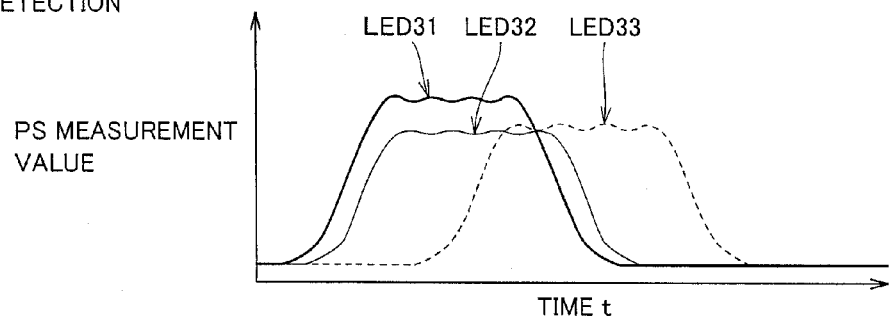

SEMICONDUCTOR DEVICE AND ELECTRONIC APPARATUS EMPLOYING THE SAME

TECHNICAL FIELD

The present invention relates to a semiconductor device and an electronic apparatus using the same. More specifically, the present invention relates to a semiconductor device for detecting a movement of a reflecting object and to an electronic apparatus using the same.

BACKGROUND ART

Conventionally, a portable telephone having a touch panel of a switch structure allowing key operations and a display device for displaying keys and the like to be operated on the touch panel arranged superposed thereon has been known (see, for example, Japanese Utility Model Laying-Open No. 1-153759 (Patent Literature 1)).

Further, a portable telephone having a plurality of motion sensors provided in a housing, for monitoring movements corresponding to dial numbers based on output signal patterns of the motion sensors, and dialing accordingly has also been known (see, for example, Japanese Patent Laying-Open No. 2000-78262 (Patent Literature 2)).

Further, a device analyzing direction, intensity and number of movements detected by a motion detecting unit, analyzing types of user actions by calculating frequency distribution of movements and outputting an operation instruction corresponding to the result of analysis has been known (see, for example, Japanese Patent Laying-Open No. 2000-148351 (Patent Literature 3)).

CITATION LIST

Patent Literature

PTL 1: Japanese Utility Model Laying-Open No. 1-153759
PTL 2: Japanese Patent Laying-Open No. 2000-78262
PTL 3: Japanese Patent Laying-Open No. 2000-148351

SUMMARY OF INVENTION

Technical Problem

The portable telephone according to Patent Literature 1 is operated by the user directly touching the touch panel and, therefore, it has a problem that the surface of touch panel becomes tainted and sensitivity degrades.

Portable telephones according to Patent Literatures 2 and 3 require provision of a plurality of motion sensors, resulting in larger size and higher cost of the apparatuses. Further, it is necessary for the user to move the housing and, therefore, there is a possibility that the housing bumps against something and is broken.

Further, the operation instructing device according to Patent Literature 3 analyzes the type of user action by calculating frequency distribution of movements and, therefore, configuration is complicated.

Therefore, a main object of the present invention is to provide a semiconductor device capable of detecting a movement of a reflecting object in a contactless manner, without using any motion sensor, as well as to provide an electronic apparatus using the same.

Solution to Problem

The present invention provides a semiconductor device, including: first to N-th (N is an integer not smaller than 2) driving terminals connected to first to N-th infrared emitting units, respectively; a driving unit driving the first to N-th infrared emitting units through the first to N-th driving terminals to cause light emission from the first to N-th infrared emitting units at mutually different timings; a first light receiving unit receiving infrared light emitted from the first to N-th infrared emitting units and reflected by a reflecting object, and generating a photo-electric current of a level corresponding to intensity of the received infrared light; an operation control unit generating first to N-th pieces of infrared light information indicating intensity of infrared light emitted from the first to N-th infrared emitting units respectively and reflected by the reflecting object, based on the photo-electric current generated by the first light receiving unit; and an output terminal for outputting the first to N-th pieces of infrared light information to the outside.

Preferably, the driving unit supplies first to N-th driving currents to the first to N-th infrared emitting units to cause light emission by the first to N-th infrared emitting units, respectively; and the first to N-th driving currents can be set individually.

Preferably, the operation control unit controls the driving unit.

Preferably, the operation control unit removes steady component from the photo-electric current generated at the first light receiving unit, and generates the first to N-th pieces of infrared light information based on the photo-electric current with the steady component removed.

Preferably, the operation control unit operates in accordance with a control signal, and the device includes an input terminal for applying the control signal from outside to the operation control unit.

Preferably, the operation control unit includes a register for storing the first to N-th pieces of infrared light information and the control signal.

Preferably, the semiconductor device further includes a second light receiving unit generating a photo-electric current of a level corresponding to intensity of incident visible light, and the operation control unit generates a piece of visible light information representing intensity of visible light entering the second light receiving unit, based on the photo-electric current generated at the second light receiving unit, and outputs the generated piece of visible light information to the outside through the output terminal.

Preferably, the semiconductor device further includes a power supply terminal for supplying a power supply voltage from outside to the driving unit and the operation control unit; and a ground terminal for supplying a ground voltage from outside to the driving unit and the operation control unit.

Further, the present invention provides an electronic apparatus, including: the above-described semiconductor device, and a detecting unit detecting a movement of the reflecting object based on the first to N-th pieces of infrared information from the semiconductor device.

Further, according to another aspect, the present invention provides a semiconductor device, including: a driving terminal connected to an infrared emitting unit; a driving unit driving the infrared emitting unit through the driving terminal to cause the infrared emitting unit to emit light at a predetermined timing; a light receiving unit receiving light emitted from the infrared emitting unit and reflected by a reflecting object, and generating a photo-electric current of a level corresponding to intensity of the received infrared light; an operation control unit generating a piece of infrared light information representing intensity of infrared light emitted from the infrared emitting unit and reflected by the reflecting object, based on the photo-electric current generated at the light receiving unit; and an output terminal for outputting the piece of infrared light information to the outside.

Preferably, the operation control unit operates in accordance with a control signal, and the device further includes an input terminal for applying the control signal from the outside to the operation control unit.

Preferably, the operation control unit includes a register for storing the piece of infrared light information and the control signal.

According to a further aspect, the present invention provides the above-described semiconductor device, and a detecting unit for detecting a movement of the reflecting object based on the piece of infrared light information from the semiconductor device.

Advantageous Effects of Invention

In the semiconductor device in accordance with the present invention, light is emitted from the first to N-th infrared light emitting units at mutually different timings, the infrared light emitted from the first to N-th infrared light emitting units and reflected from the reflecting object is converted to a photo-electric current by the first light receiving unit, and the first to N-th pieces of infrared light information representing intensities of the infrared light are generated. Therefore, it becomes possible to detect a movement of the reflecting object in contactless manner based on the first to N-th pieces of infrared light information, without using any motion sensor.

BRIEF DESCRIPTION OF DRAWINGS

FIG. 2 shows a method of communication between the MCU and the data register shown in FIG. 1.

FIG. 3 shows a configuration of a data register shown in FIG. 1.

FIG. 4 shows a configuration of a register ALS_CONTROL shown in FIG. 3.

FIG. 5 shows a configuration of a register PS_CONTROL shown in FIG. 3.

FIG. 6 shows a configuration of a register I_LED shown in FIG. 3.

FIG. 7 shows a configuration of a register I_LED 33 shown in FIG. 3.

FIG. 8 shows a configuration of a register ALS_PS_MEAS shown in FIG. 3.

FIG. 9 shows a configuration of a register PS_MEAS_RATE shown in FIG. 3.

FIG. 10 shows a configuration of a register ALS_PS_STATUS shown in FIG. 3.

FIG. 11 shows a configuration of a register PS_DATE_LED shown in FIG. 3.

FIG. 12 shows a configuration of a register INTERRUPT shown in FIG. 3.

FIG. 13 shows a configuration of a register PS_TH_LED shown in FIG. 3.

FIG. 14 shows examples of data stored in the register PS_DATE_LED 31 shown in FIG. 3.

FIG. 22 is a time chart representing a hand gesture detecting function of the portable telephone shown in FIG. 19.

DESCRIPTION OF EMBODIMENTS

Figure 1:
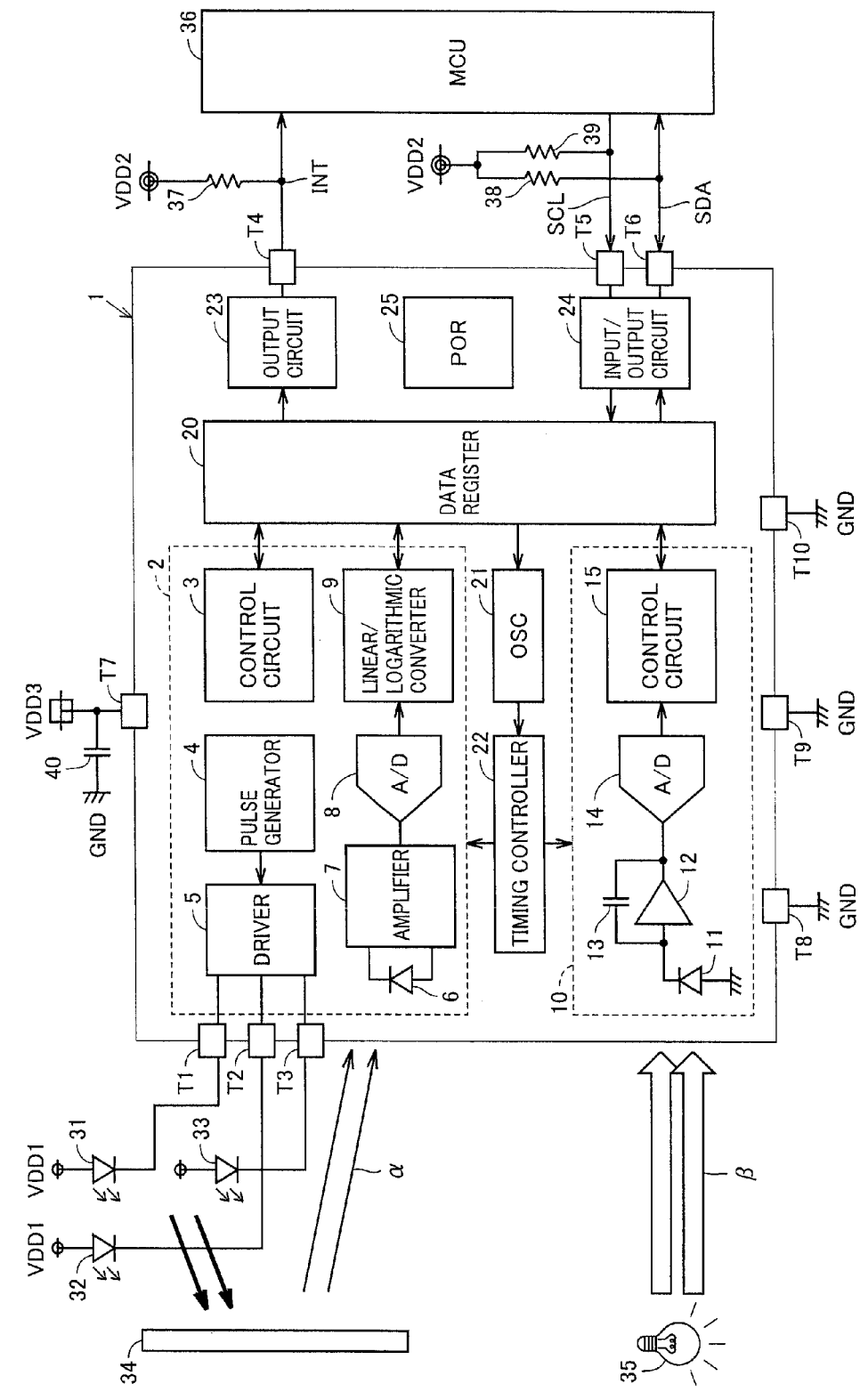
FIG. 1 is a block diagram representing a configuration of the semiconductor device in accordance with an embodiment of the present invention.

A semiconductor device 1 in accordance with an embodiment of the present invention includes, as shown in FIG. 1, a proximity sensor 2, an ambient light sensor 10, a data register 20, an oscillator (OSC) 21, a timing controller 22, a signal output circuit 23, a signal input/output circuit 24, a power-on-reset circuit (POR) 25, driving terminals T1 to T3, a signal output terminal T4, a clock input terminal T5, a serial data input/output terminal T6, a power supply terminal T7, ground terminals T8 and T9, and a test terminal T10.

Driving terminals T1 to T3 are connected to cathodes of infrared LEDs (Light Emitting Diodes) 31 to 33, respectively. Infrared LEDs 31 to 33 all receive, at their anodes, a power supply voltage VDD1. Proximity sensor 2 includes a control circuit 3, a pulse generator 4, a driver 5, an infrared sensor 6, an amplifier 7, an A/D converter 8, and a linear/logarithmic converter 9. Control circuit 3 controls proximity sensor 2 as a whole, in accordance with control signals stored in data register 20.

Pulse generator 4 generates a pulse signal for driving infrared LEDs 31 to 33. Driver 5 maintains each of driving terminals T1 to T3 at a high-impedance state, and renders any of the driving terminals T1 to T3 grounded in response to the pulse signal generated by pulse generator 4. It is possible to select, by the signals stored in data register 20, which one, two, or three of the infrared LEDs 31 to 33 are to be used. Further, it is possible to set, by the signals stored in data register 20, the current value to be caused to flow through each selected infrared LED and the period of emission by each selected infrared LED (see FIGS. 3, 6, 7 and 9).

When any of driving terminals T1 to T3 is grounded by driver 5, current flows through the infrared LED corresponding to the driver terminal, and infrared light is emitted from the infrared LED. The infrared light α emitted from the infrared LED is reflected by a reflecting object 34 and enters infrared sensor 6. Infrared light from the sun also enters infrared sensor 6. Infrared sensor 6 is formed, for example, by a photo diode having peak wavelength of 850 nm. Infrared sensor 6 generates a photo-electric current of a level corresponding to the light intensity of incident infrared light α. The photo-electric current contains pulse component derived from the infrared light α from infrared LEDs 31 to 33 and a DC component derived from the infrared light from the sun.

Amplifier 7 amplifies only the pulse component of photo-electric current generated by infrared sensor 6, and outputs an analog voltage of a level corresponding to the light intensity of infrared light α incident on infrared sensor 6. A/D converter 8 converts the analog voltage output from amplifier 7 to a digital signal. The level of analog signal and the numerical value of digital signal are in linear relation. Linear/logarithmic converter 9 calculates a log of the numerical value of the digital signal generated by A/D converter 8, and stores an 8-bit digital signal representing the calculated log in data register 20 (see FIGS. 3 and 11).

Ambient light sensor 10 includes a visible light sensor 11, an amplifier 12, a capacitor 13, an A/D converter 14, and a control circuit 15. Visible light β generated by a visible light source 35 in the vicinity of semiconductor device 1 enters visible light sensor 11. Visible light source 35 may be a fluorescent lamp, an incandescent lamp or the sun. Visible light sensor 11 is formed, for example, of a photo diode having peak wavelength of 550 nm. Visible light sensor 11 generates a photo-electric current of a level corresponding to the intensity of incident visible light β.

Amplifier 12 and capacitor 13 convert the photo-electric current to an analog voltage. A/D converter 14 converts the analog voltage to a 16-bit digital signal and applies it to control circuit 15. Control circuit 15 controls ambient light sensor 10 as a whole in accordance with control signals stored in data register 20, and stores the digital signal generated by A/D converter 14 in data register 20 (see FIGS. 3 and 4).

Oscillator 21 generates clock signals in accordance with the control signals stored in data register 20. Timing controller 22 controls operation timing of each of proximity sensor 2 and ambient light sensor 10 in synchronization with the clock signals from oscillator 21.

Signal output terminal T4 is connected to an MCU (Micro Control Unit) 36 through a signal line, and connected to a line of a power supply voltage VDD2 though a resistor element 37. Output circuit 23 applies an interrupt signal INT to MCU 36, by setting a signal output terminal T4 to the grounded state or floating state in accordance with an interrupt signal INT stored in data register 20. The interrupt signal INT is activated when intensity of infrared light α incident on infrared sensor 6 exceeds a prescribed threshold value, or when intensity of visible light β incident on visible light sensor 11 exceeds a prescribed range. When to activate the interrupt signal INT can be set by signals stored in data register 20 (see FIGS. 3, 10, 12 and 13).

A clock input terminal T5 is connected through a signal line to MCU 36, and connected to the line of power supply voltage VDD2 through a resistor element 39. A serial data input/output terminal T6 is connected through a signal line to MCU 36, and connected to the line of power supply voltage VDD2 through a resistor element 38. MCU 36 applies the clock signal SCL through signal input/output circuit 24 to data register 20, by setting clock input terminal T5 to the grounded state or floating state. Further, MCU 36 applies the serial data signal SDA through signal input/output circuit 24 to data register 20, by setting serial data input/output terminal T6 to the grounded state or floating state.

Data register 20 operates in synchronization with the clock signal SCL applied from MCU 36, and stores the serial data signal SDA applied from MCU 36 in a selected address. Further, data register 20 operates in synchronization with the clock signal SCL applied from MCU 36, and reads stored data from a selected address and applies the read data as the serial data signal SDA to MCU 36 through signal input/output circuit 24 and serial data input/output terminal T6.

Output circuit 23 transmits the interrupt signal INT output from data register 20 through signal output terminal T4 to MCU 36. If the interrupt signal INT output from data register 20 is at the "H" level, output circuit 23 sets signal output terminal T4 to a high-impedance state, and if the interrupt signal INT output from data register 20 is at the "L" level, sets signal output terminal T4 to the "L" level.

Signal input/output circuit 24 transmits the clock signal SCL applied from MCU 36 through clock input terminal T5 to data register 20, and transmits the serial data signal SDA applied from MCU 36 through serial data input/output terminal T6 to data register 20.

Further, signal input/output circuit 24 transmits the serial data signal output from data register 20 through serial data input/output terminal T6 to MCU 36. If the data signal output from data register 20 is at the "H" level, signal input/output circuit 24 sets the serial data input/output terminal T6 to the high-impedance state, and if the data signal output from data register 20 is at the "L" level, sets the serial data input/output terminal to the "L" level. Power-on-reset circuit 25 resets data in data register 20 in response to activation/application of power supply voltage VDD3.

To a power supply terminal T7, power supply voltage VDD3 for driving semiconductor device 1 is applied. Further, to power supply terminal T7, one electrode of a capacitor 40 for stabilizing power supply voltage VDD3 is connected. The other electrode of capacitor 40 is grounded. A ground terminal T8 is a terminal for letting out current from LEDs 31 to 33, and it is grounded. A ground terminal T9 is a terminal for applying ground voltage GND to internal circuits 2 to 15 and 20 to 25 in semiconductor device 1. A test terminal T10 is set to the "H" level in a test mode, and is grounded as shown in FIG. 1 in a normal operation.

FIG. 2 shows, from (a) to (d), a method of communication between MCU 36 and data register 20. According to this method of communication, data reading and data writing from a master to a plurality of slaves are possible. Here, MCU 36 is the master and data register 20 is the slave. A slave is selected by a 7-bit slave address (in the figure, 0111000). Typically, a read/write flag is added to the 7-bit slave address. The serial clock signal SCL is output from the master. The slave inputs/outputs the serial data signal SDA in synchronization with the serial clock signal SCL from the master. Specifically, the slave takes in the serial data signal SDA in synchronization with the serial clock signal SCL, and in reverse, outputs the serial data signal SDA in synchronization with the serial clock signal SCL.

Information communication starts from a start condition ST from the master side and ends at a stop condition SP. The start condition ST is set when the serial data signal SDA changes from the "H" level to the "L" level while the serial clock signal SCL is at the "H" level. The stop condition SP is set when the serial data signal SDA changes from the "L" level to the "H" level while the serial clock signal SCL is at the "H" level.

Data bits are established while the serial clock signal SCL is at the "H" level. The level of serial data signal SDA is kept constant while the serial clock signal SCL is at the "H" level, and is changed while the serial clock signal SCL is at the "L" level. The data unit is 1 byte (8 bits), and the data is transferred successively from the upper bit. At every 1 byte, the receiving side returns a signal ACK (0 of 1 bit) to the transmitting side. It is also possible to return a signal NACK (1 of 1 bit) after receiving 1 byte. The signal NACK is used when the master notifies the slave of the end of transfer, at the time of data transfer from the salve to the master.

A series of communications always starts at the start condition ST from the master. One byte immediately following the start condition ST contains 7 bits of slave address and 1 bit of read/write flag. The read/write flag is set to 0 if transfer is from the master to the slave, and it is set to 1 if the transfer is from the slave to the master. When the slave receiving the slave address returns the signal ACK to the master, communication between the master and the slave is established.

When an address of data register 20 as the slave is to be designated, MCU 36 as the master sets the start condition ST, transmits the slave address of 7 bits, sets the read/write flag to 0, transmits a register address of 1 byte (in the figure, 100xxxxx) in response to the signal ACK from the slave, and transmits the stop condition SP in response to the signal ACK from the slave, as shown in FIG. 2(a). In the figure, "x" represents 0 or 1.

When data is to be written designating an address of data register 20 as the slave, MCU 36 as the master sets the start condition ST, transmits the slave address of 7 bits, sets the read/write flag to 0, transmits a register address of 1 byte (in the figure, 100xxxxx) in response to the signal ACK from the slave, and transmits the date byte by byte, in response to the signal ACK from the slave. The slave returns the signal ACK every time it receives the data of 1 byte. When the data transmission ends, the master sets the stop condition ST, and the communication ends, as shown in FIG. 2(b).

When data is to be read designating an address of data register 20 as the slave, MCU 36 as the master sets the start condition ST, transmits the slave address of 7 bits, sets the read/write flag to 0, and transmits a register address of 1 byte (in the figure, 100xxxxx) in response to the signal ACK from the slave, as shown in FIG. 2(c).

Further, in response to the signal ACK from the slave, the master again sets the start condition ST, transmits the slave address of 7 bits, and sets the read/write flag to 1. The slave returns the signal ACK, and transmits data byte by byte to the master. The master returns the signal ACK every time it receives the data of 1 byte. Receiving the last data, the master returns the signal NACK and then sets the stop condition SP, and thus, the communication ends.

When data is to be read without designating an address of data register 20 as the slave, MCU 36 as the master sets the start condition ST, transmits the slave address of 7 bits, and sets the read/write flag to 1, as shown in FIG. 2(d). The slave returns the signal ACK, and transmits data byte by byte to the master. The master returns the signal ACK every time it receives the data of 1 byte. Receiving the last data, the master returns the signal NACK and then sets the stop condition SP, and thus, the communication ends.

FIG. 3 shows the configuration of data register 20. Referring to FIG. 3, addresses 80h to 86h and 92h to 99h of data register 20 are used for reading and writing (RW) of information, whereas addresses 8Ah to 91h are used for reading (R) information. Addresses 80h to 86h, 92h to 99h and 8Ah to 91h each form a register. The address is in hexadecimal notation (h).

In a register ALS_CONTROL at address 80h, pieces of information related to ALS (Ambient Light Sensor) operation mode control and SW (Software) reset are stored. In a register PS_CONTROL at address 81h, pieces of information related to PS (Proximity Sensor) operation mode control are stored. In a register I_LED at address 82h, pieces of information related to selection of an LED to be activated, and setting of currents of LEDs 31 and 32 are stored. In a register I_LED 33 at address 83h, pieces of information related to setting of current of LED 33 are stored.

In a register ALS_PS_MEAS at address 84h, pieces of information related to a forced mode trigger are stored. In a register PS_MEAS_RATE at address 85h, pieces of information related to the PS measurement rate in the stand alone mode are stored. In a register ALS_MEAS_RATE at address 86h, pieces of information related to the ALS measurement rate in the stand alone mode are stored. In a register PART_ID at address 8Ah, part number and revised ID (Identification data), specifically, the ID of proximity sensor 2, are stored. In a register MANUFACT_ID at address 8Bh, an ID of the manufacturer of semiconductor device 1 is stored.

In a register ALS_DATA_0 at address 8Ch, a lower byte of result of measurement of ambient light sensor 10 is stored. In a register ALS_DATA_1 of address 8Dh, an upper byte of result of measurement of ambient light sensor 10 is stored. In a register ALS_PS_STATUS at address 8Eh, pieces of information related to the measurement data and the state of interrupt are stored.

In a register PS_DATA_LED31 at address 8Fh, proximity data from LED 31 (measurement data of infrared light from LED 31) is stored. In a register PS_DATA_LED32 at address 90h, proximity data from LED 32 (measurement data of infrared light from LED 32) is stored. In a register PS_DATA_LED33 at address 91h, proximity data from LED 33 (measurement data of infrared light from LED 33) is stored.

In a register INTERRUPT at address 92h, pieces of information related to setting of interrupt are stored. In a register PS_TH_LED31 at address 93h, PS interrupt threshold value for LED 31 is stored. In a register PS_TH_LED32 at address 94h, interrupt threshold value for LED 32 is stored. In a register PS_TH_LED33 at address 95h, interrupt threshold value for LED 33 is stored.

In a register ALS_TH_UP_0 at address 96h, a lower byte of the upper threshold value of ALS is stored. In a register ALS_TH_UP_1 at address 97h, an upper byte of the upper threshold value of ALS is stored. In a register ALS_TH_LOW_0 at address 98h, a lower byte of the lower threshold value of ALS is stored. In a register ALS_TH_LOW_1 at address 99h, an upper byte of the lower threshold value of ALS is stored.

Next, main registers among the plurality of registers shown in FIG. 3 will be described in greater detail. As shown in (a) and (b) of FIG. 4, addresses ADD7 to ADD3 of upper 5 bits of register ALS_CONTROL at address 80h are used as a reserve (RES) field, the following 1 bit address ADD2 is used as an SW reset field, and lower 2 bits ADD1 and ADD0 are used as an ALS mode field. To each of addresses ADD7 to ADD3, 0 is written. To address ADD2, 0 is written if initial reset is not to be started, and 1 is written if initial reset is to be started. To addresses ADD1 and ADD0, 00 or 01 is written if a standby mode is to be set, 10 is written if the forced mode is to be set, and 11 is written if the stand alone mode is to be set.

Further, as shown in (a) and (b) of FIG. 5, addresses ADD7 to ADD2 of upper 6 bits of register PS_CONTROL at address 81h are used as an NA field, and lower 2 bits ADD01 and ADD0 are used as a PS mode field. Each of addresses ADD7 to ADD3 is ignored. To addresses ADD1 and ADD0, 00 or 01 is written if a standby mode is to be set, 10 is written if the forced mode is to be set, and 11 is written if the stand alone mode is to be set.

Further, as shown in (a) and (b) of FIG. 6, addresses ADD7 and ADD6 of upper 2 bits of register I_LED at address 82h are used as PS activation field, next 3 bits ADD5 to ADD3 are used as an electric current field of LED 32, and lower 3 bits ADD2 to ADD0 are used as an electric current field of LED 31. If LED 31 is to be activated and LEDs 32 and 33 are to be inactivated, 00 is written to upper addresses ADD7 and ADD6. If LEDs 31 and 32 are to be activated and LED 33 is to be inactivated, 01 is written to upper addresses ADD7 and ADD6. If LEDs 31 and 33 are to be activated and LED 32 is to be inactivated, 10 is written to upper addresses ADD7 and ADD6. If all LEDs 31 to 33 are to be activated, 11 is written to upper addresses ADD7 and ADD6.

To middle addresses ADD5 to ADD3, any of 000 to 111 is written. If the electric current value of LED 32 is to be set to 5, 10, 20, 50, 100 and 150 mA, 000 to 101 are written, respectively. If the electric current value of LED 32 is to be set to 200 mA, either 110 or 111 is written. Therefore, in semiconductor device 1, it is possible to set the electric current value of LED 32 to a desired value among 5, 10, 20, 50, 100, 150 and 200 mA.

To lower addresses ADD2 to ADD0, any of 000 to 111 is written. If the electric current value of LED 31 is to be set to 5, 10, 20, 50, 100 and 150 mA, 000 to 101 are written, respectively. If the electric current value of LED 31 is to be set to 200 mA, either 110 or 111 is written. Therefore, in semiconductor device 1, it is possible to set the electric current value of LED 31 to a desired value among 5, 10, 20, 50, 100, 150 and 200 mA.

Further, as shown in (a) and (b) of FIG. 7, addresses ADD7 to ADD3 of upper 5 bits of register I_LED33 at address 83$h$ are used as an NA (No Assign) field, and lower 3 bits ADD2 to ADD0 are used as an electric current field of LED 33. Each of addresses ADD7 to ADD3 is ignored. Any of 000 to 111 is written to lower addresses ADD2 to ADD0. If the electric current value of LED 33 is to be set to 5, 10, 20, 50, 100 and 150 mA, 000 to 101 are written, respectively. If the electric current value of LED 33 is to be set to 200 mA, either 110 or 111 is written. Therefore, in semiconductor device 1, it is possible to set the electric current value of LED 33 to a desired value among 5, 10, 20, 50, 100, 150 and 200 mA.

Further, as shown in (a) and (b) of FIG. 8, addresses ADD7 to ADD2 of upper 6 bits of register ALS_PS_MEAS at address 84$h$ are used as the NA field, the next 1 bit address ADD1 is used as an ALS trigger field, and the lower 1 bit ADD0 is used as a PS trigger field. Addresses ADD7 to ADD2 are ignored. To address ADD1, if new ALS measurement is not to be started, 0 is written, and if new ALS measurement is to be started, 1 is written. To address ADD0, if new PS measurement is not to be started, 0 is written, and if new PS measurement is to be started, 1 is written.

Further, as shown in (a) and (b) of FIG. 9, addresses ADD7 to ADD4 of upper 4 bits of register PS_MEAS_RATE at address 85$h$ are used as the NA field, and lower 4 bits ADD3 to ADD0 are used as a PS measurement rate field. Each of addresses ADD7 to ADD4 is ignored. Any of 0000 to 1111 is written to lower addresses ADD3 to ADD0. If PS measurement rate is to be set to 10, 20, 30, 50, 70, 100, 200, 500, 1000 and 2000 msec, 0000 to 1001 are written, respectively. It can be set to 2000 msec by writing any of 1010 to 1111. Therefore, in semiconductor device 1, PS measurement rate can be set to a desired value from 10 to 2000 msec.

Further, as shown in (a) and (b) of FIG. 10, addresses ADD7 to ADD0 of register ALS_PS_STATUS at address 8Eh are used as INT status field of ALS, data status field of ALS, INT status field of LED 33, data status field of LED 33, INT status field of LED 32, data status field of LED 32, INT status field of LED 31 and data status field of LED 31, respectively.

To address ADD7, in ALS measurement, if the signal INT is to be inactivated, 0 is written and if the signal TNT is to be activated, 1 is written. To address ADD6, in ALS measurement, if data is already-read old data, 0 is written, and if the data is not-yet-read new data, 1 is written.

To address ADD5, in PS measurement of LED 33, if the signal INT is to be inactivated, 0 is written and if the signal INT is to be activated, 1 is written. To address ADD4, in PS measurement of LED 33, if data is already-read old data, 0 is written, and if the data is not-yet-read new data, 1 is written.

To address ADD3, in PS measurement of LED 32, if the signal INT is to be inactivated, 0 is written and if the signal INT is to be activated, 1 is written. To address ADD2, in PS measurement of LED 32, if data is already-read old data, 0 is written, and if the data is not-yet-read new data, 1 is written.

To address ADD1, in PS measurement of LED 31, if the signal INT is to be inactivated, 0 is written and if the signal INT is to be activated, 1 is written. To address ADD0, in PS measurement of LED 31, if data is already-read old data, 0 is written, and if the data is not-yet-read new data, 1 is written.

Further, as shown in (a) and (b) of FIG. 11, addresses ADD7 to ADD0 of register PS_DATA_LED31 at address 8Fh are used as data field of LED 31. In addresses ADD7 to ADD0, PS measurement data of LED 31 are stored.

Addresses ADD7 to ADD0 of register PS_DATA_LED32 at address 90$h$ are used as data field of LED 32. In addresses ADD7 to ADD0, PS measurement data of LED 32 are stored.

Addresses ADD7 to ADD0 of register PS_DATA_LED33 at address 91$h$ are used as data field of LED 33. In addresses ADD7 to ADD0, PS measurement data of LED 33 are stored.

Further, as shown in (a) and (b) of FIG. 12, addresses ADD7 and ADD4 of register INTERRUPT at address 92$h$ are both used as the NA field, and addresses ADD6 and ADD5 are used as an interrupt source field. Further, address ADD3 is used as an output mode field, and address ADD2 is used as an INT polarity field. Addresses ADD1 and ADD0 are used as an interrupt mode field. Addresses Add7 and ADD4 are ignored.

To addresses ADD6 and ADD5, 00 is written if an interrupt is triggered by the ALS, 01 is written if an interrupt is triggered by LED 31, 10 is written if an interrupt is triggered by LED 32, and 11 is written if an interrupt is triggered by LED 33.

To address ADD3, 0 is written if the level of an INT pin (signal output terminal T4) is to be latched until register INTRRUPT is read, and 1 is written if the level of the INT pin is to be updated after each measurement. To address ADD2, 0 is written if the INT pin is set to logic 0 ("L" level) when the signal INT is activated, and 1 is written if the INT pin is set to logic 1 ("H" level) when the signal INT is activated.

To addresses ADD1 and ADD0, 00 is written if the INT pin is to be inactivated (high impedance state), 01 is written if the PS measurement can be triggered, 10 is written if the ALS measurement can be triggered, and 11 is written if the PS and ALS measurements can be triggered.

Further, as shown in (a) and (b) of FIG. 13, addresses ADD7 to ADD0 of register PS_TH_LED31 at address 93$h$ are used as a threshold field of LED 31. In addresses ADD7 to ADD0, a threshold value of LED 31 is stored.

Addresses ADD7 to ADD0 of register PS_TH_LED32 at address 94$h$ are used as the threshold field of LED 32. In addresses ADD7 to ADD0, a threshold value of LED 32 is stored.

Addresses ADD7 to ADD0 of register PS_TH_LED33 at address 95$h$ are used as the threshold field of LED 33. In addresses ADD7 to ADD0, a threshold value of LED 33 is stored.

Further, as shown in FIG. 14, addresses ADD7 to ADD0 of register PS_DATA_LED 31 at address 8Fh are used as the PS data field of LED 31. To addresses ADD7 to ADD0, PS data of LED 31 are stored. By way of example, if 10000101 is written to addresses ADD7 to ADD0, light intensity is represented by $10^A$, where $A=(2^7+2^2+2^0) \times 0.097 = 133 \times 0.097$. Therefore, light intensity is $10^A = 417$ ($\rho W/cm^2$).

Figure 15:
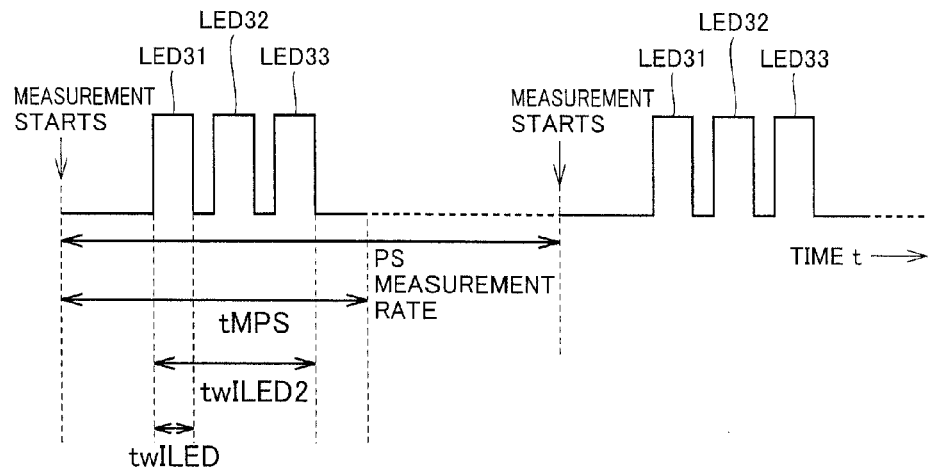
FIG. 15 is a time chart representing a method of measuring PS of the semiconductor device shown in FIG. 1.

FIG. 15 is a time chart representing a measurement sequence of proximity sensor 2. FIG. 15 shows an example in which all LEDs 31 to 33 are activated. Infrared LEDs 31 to 33 successively emit light, each for a prescribed time period, in one measurement period. Here, twILED represents duration of an LED current pulse (one emission time period of each infrared LED), which is, for example, 300 μsec, and twILED2 represents accumulative duration of LED current pulse (time period from the start of emission of infrared LED 31 to stop of emission of infrared LED 33), which is, for example, 1 msec. Further, tMPS represents a measurement time of the proximity sensor, which is, for example, 10 msec. The result of measurement is generated within this period tMPS. The PS measurement rate (measurement period) is used only in the stand alone mode, and it is determined by the register PS_MEAS_RATE (85h) shown in FIG. 9.

If a measurement command is written by the master to register PS_CONTROL (81h) shown in FIG. 5, the first PS measurement is triggered. A combination of infrared LEDs 31 to 33 is set by register I_LED (82h) shown in FIG. 6 and register I_LED33 (83h) shown in FIG. 7. If infrared LED 32 only is to be inactivated, there is no spare time between the pulse of LED 31 and the pulse of LED 33.

In the forced mode, the PS measurement is done only once. The PS trigger bit (ADD0 of 84h) is overwritten from 1 to 0 after the completion of PS measurement. When 1 is written to the PS trigger bit by the master, PS measurement is again started. In the stand alone mode, the PS measurement is continued until the master designates another mode. Measurement interval is determined by register PS_MEAS_RATE (85h) shown in FIG. 9.

Figure 16:
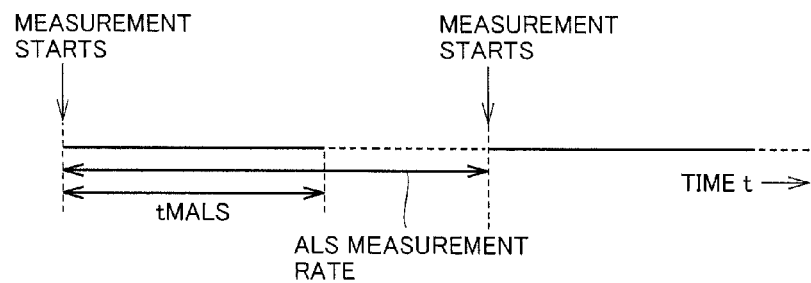
FIG. 16 is a time chart representing a method of measuring ALS of the semiconductor device shown in FIG. 1.

FIG. 16 is a time chart representing a measurement sequence of ambient light sensor 10. In FIG. 16, tMALS represents the measurement time of ambient light sensor, which is, for example, 100 msec. The result of measurement is generated within this period. The ALS measurement rate (measurement period) is used only in the stand alone mode, and it is determined by register ALS_MEAS_RATE (86h). When a measurement command is written by the master to register ALS_CONTROL (80h) shown in FIG. 4, the first ALS measurement is triggered.

In the forced mode, the ALS measurement is done only once. The ALS trigger bit (ADD1 of 80h) is overwritten from 1 to 0 after the completion of ALS measurement. When 1 is written by the master to the ALS trigger bit, the ALS measurement is again started. In the stand alone mode, the ALS measurement is continued until the master designates another mode. The measurement interval is determined by register ALS_MEAS_RATE (86h) shown in FIG. 3.

Figure 17:
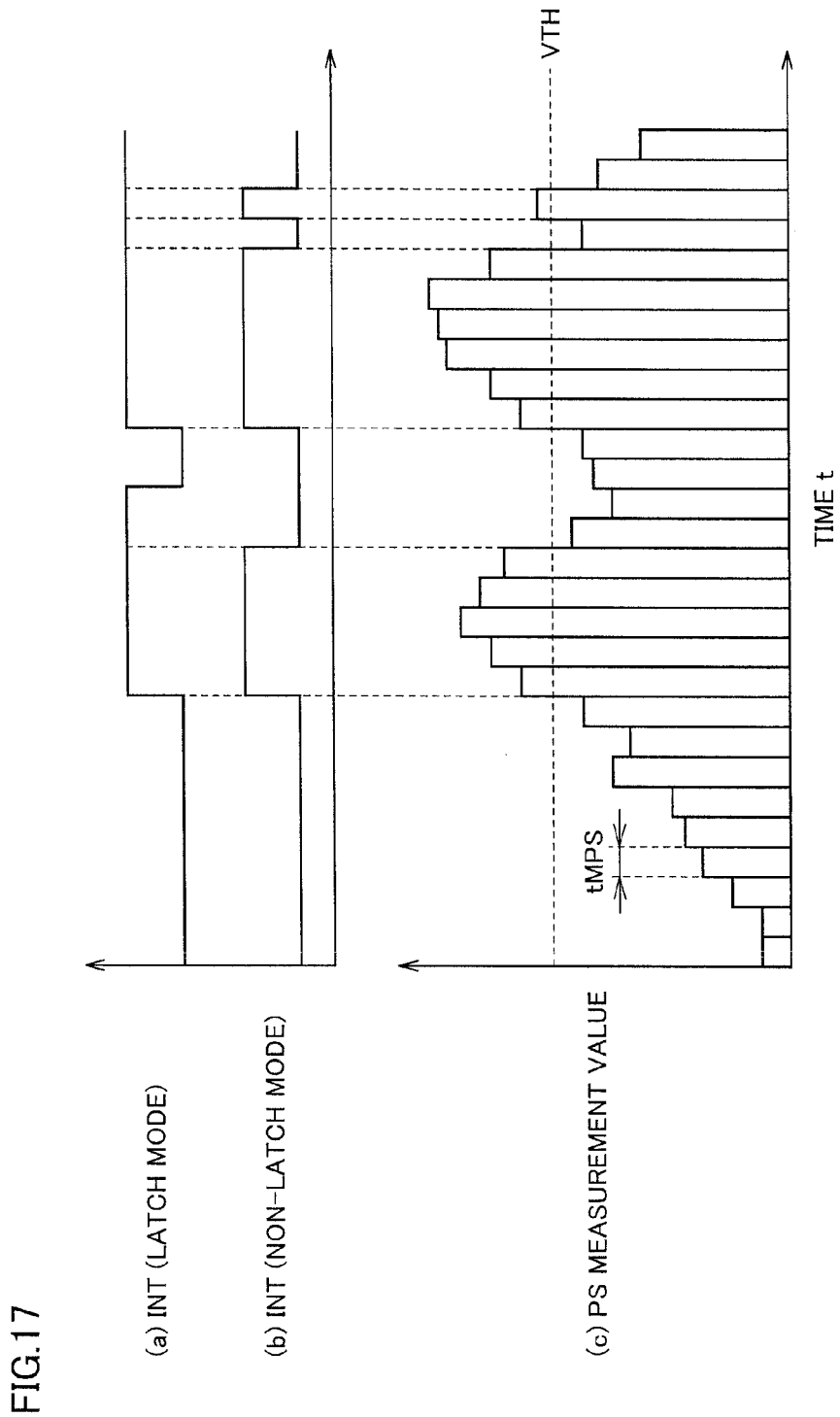
FIG. 17 is a time chart representing an interrupting function of the semiconductor device shown in FIG. 1.

FIG. 17 is a time chart representing, at (a) to (c), the interrupt function. Specifically, FIG. 17(a) represents the interrupt signal INT in a latch mode, FIG. 17(b) represents the interrupt signal INT in a non-latch mode and FIG. 17(c) represents PS measurement value (PS measurement data). As the source of interrupt, ALS measurement and any of the three LEDs 31 to 33 may be selected as the source of interrupt as shown in (a) and (b) of FIG. 12. Here, it is assumed that, by way of example, LED 31 is selected as the source of interrupt.

As shown in FIG. 15, the PS measurement value is updated at every measurement period tMPS. The threshold values VTH of LEDs 31 to 33 are stored in register PS_TH_LED (93h, 94h, 95h). If the PS measurement value for LED 31 exceeds the threshold value VTH, the interrupt signal INT makes a transition from the inactive level ("L" level in the figure) to the active level ("H" level in the figure).

The output mode of interrupt signal INT includes the latch mode and the non-latch mode as shown in (a) and (b) of FIG. 12. In the latch mode, the level of interrupt signal INT is latched until the master reads the register INTERRUPT, as shown in (a) of FIG. 17. In the non-latch mode, the level of interrupt signal INT is updated after each PS measurement, as shown in (b) of FIG. 17. The same applies when LED 32 or 33 is selected as the source of interrupt.

If the ALS measurement is selected as the source of interrupt, the ALS measurement value is updated at every measurement period tMALS, as shown in FIG. 16. The upper threshold value VTHU for the ALS measurement is stored in register ALS_TH_UP (96h, 97h) shown in FIG. 3. The lower threshold value for the ALS measurement is stored in register ALS_TH_LOW (98h, 99h) shown in FIG. 3. If the ALS measurement value is between the lower threshold value VTHL and the upper threshold value VTHU, the interrupt signal INT is set to the inactive level (for example, "L" level). If the ALS measurement value is lower than the lower threshold value VTHL, or if the ALS measurement value is higher than the upper threshold value VTHU, the interrupt signal INT is set to the active level (for example, "H" level).

Figure 18:
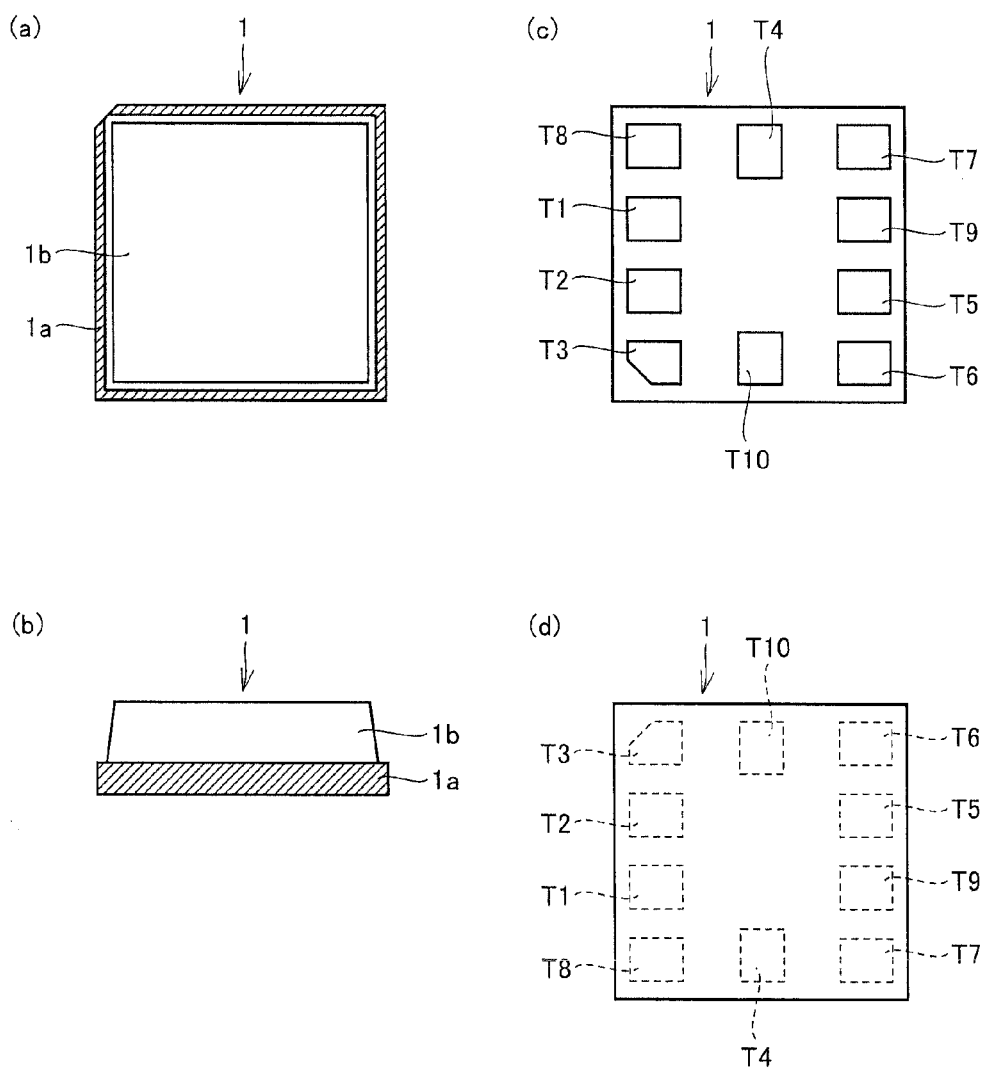
FIG. 18 shows an appearance of the semiconductor device shown in FIG. 1.

FIG. 18 shows, at (a) to (d), an appearance of semiconductor device 1. Specifically, in FIG. 18, (a) is a top view of semiconductor device 1, (b) is a front view, (c) is a bottom view and (d) is a diagram of arrangement of terminals T1 to T10 viewed from above semiconductor device 1. Referring to (a) to (d) of FIG. 18, semiconductor device 1 includes a printed circuit board 1a. Printed circuit board 1a is formed to have a square shape with the length of one side being, for example, 2.8 mm.

On a surface of printed circuit board 1a, circuits 2 to 15 and 20 to 25 shown in FIG. 1 are mounted. The surface of printed circuit board 1a is sealed with transparent resin 1b. The height of semiconductor device 1 is, for example, 0.9 mm. On a back surface of printed circuit board 1a, terminals T1 to T10 are provided. Terminals T1 to T10 are arranged in a prescribed order, along four sides of printed circuit board 1a.

Figure 19:
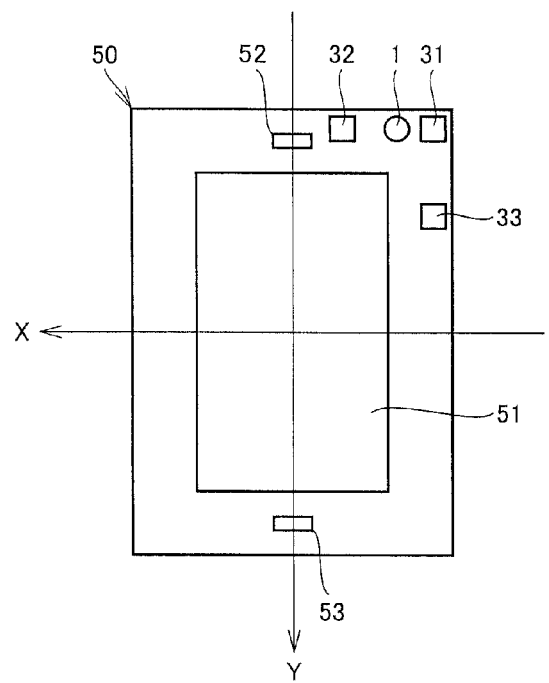
FIG. 19 shows an example of a method of using the semiconductor device shown in FIG. 1.

FIG. 19 shows an example of a method of using semiconductor device 1. Referring to FIG. 19, semiconductor device 1 is mounted, together with three infrared LEDs 31 to 33, on a portable telephone 50. Portable telephone 50 is formed to have a longitudinal rectangular shape. At the central portion of portable telephone 50, a touch panel 51 is provided, and a speaker 52 and a microphone 53 are provided above and below touch panel 51, respectively. Infrared LED 31 is arranged at an upper right corner on a surface of portable telephone 50; infrared LED 32 is arranged at a position a prescribed distance away in the X direction (left direction) in the figure from infrared LED 31; and infrared LED 33 is arranged at a position a prescribed distance away in the Y direction (downward direction) in the figure from infrared LED 31. Semiconductor device 1 is arranged adjacent to infrared LED 31 in the X direction.

Figure 20:
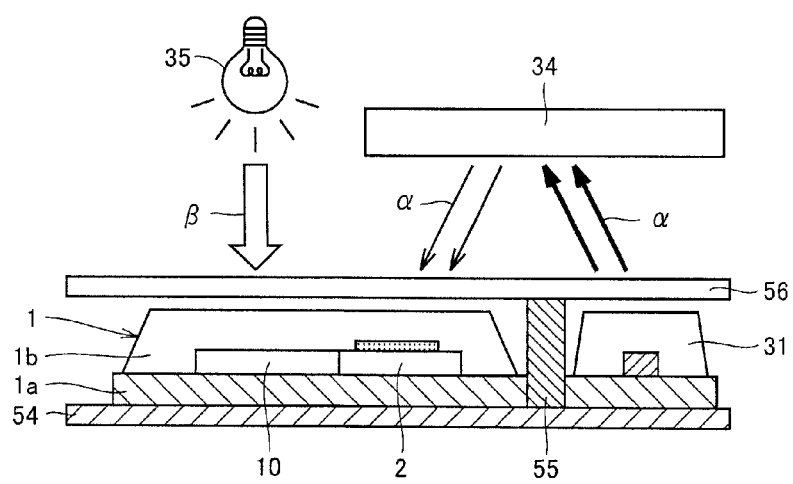
FIG. 20 shows an arrangement of an infrared LED and the semiconductor device shown in FIG. 19.

FIG. 20 shows semiconductor device 1 and infrared LED 31 mounted on portable telephone 50. Referring to FIG. 20, semiconductor device 1 and infrared LED 31 are arranged adjacent to each other on a surface of a printed circuit board 54. On printed circuit board 1a of semiconductor device 1, proximity sensor 2 and ambient light sensor 10 are mounted, and the surface of printed circuit board 1a is sealed with transparent resin 1b. On printed circuit board 54, a transparent plate 56 is placed with a light intercepting spacer 55 interposed, and by transparent plate 56, semiconductor device 1 and infrared LED 31 are protected.

Infrared light α emitted from infrared LED 31 is reflected by a reflecting object 34 and enters proximity sensor 2. Proximity sensor 2 stores PS measurement data of the level in accordance with the intensity of incident infrared light α in data register 20. Reflecting object 34 is, by way of example, an ear or hand of the user of portable telephone 50. Further, visible light β emitted from visible light source 35 enters ambient light sensor 10. Ambient light sensor 10 stores ALS measurement data representing illuminance of incident visible light β in data register 20.

Figure 21:
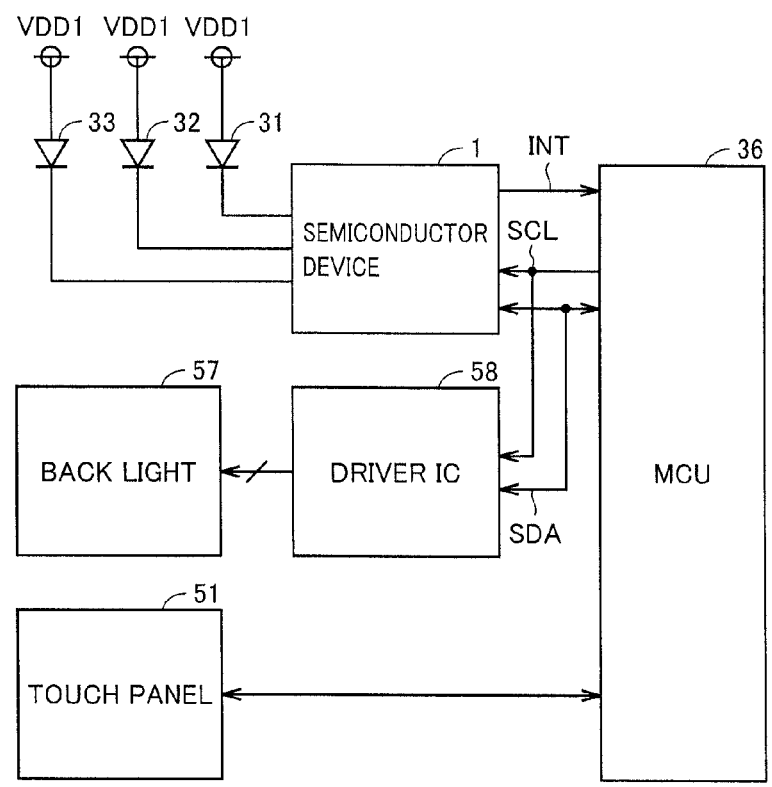
FIG. 21 is a circuit block diagram representing a main portion of the portable telephone shown in FIG. 19.

In portable telephone 50, MCU 36, a back light 57 and a driver IC 58 are provided, as shown in FIG. 21. Back light 57 provides transmitted light to touch panel 51. Driver IC 58 drives back light 57 in accordance with a control signal from MCU 36. MCU 36 controls portable telephone 50 as a whole in accordance with signals from touch panel 51. Further, MCU 36 controls driver IC 58 and touch panel 51 in accordance with data signals from semiconductor device 1.

Specifically, MCU 36 detects illuminance of the place where portable telephone 50 is used from the data signal (ALS measurement data) from semiconductor device 1, and controls brightness of back light 57 in accordance with the detected illuminance. Thus, an image displayed on touch pane 51 can be made sharp and clear. Further, power consumption can be reduced.

If it is detected that touch panel 51 of portable telephone 51 comes close to the ear of the user of portable telephone 50 from the data signal (PS measurement data) from semiconductor device 1, MCU 36 stops the function of touch panel 51. Thus, erroneous function otherwise caused when the ear of the user of portable telephone 50 touches touch panel 51 can be prevented.

Further, MCU 36 detects hand gesture of the user of portable telephone 50 based on PS measurement values representing intensity of reflected light of infrared LEDs 31 to 33, and realizes the scroll operation of images displayed on touch panel 51 in accordance with the result of detection. Specifically, if the user of portable telephone 50 moves his/her hand in the X direction of FIG. 19 on the surface of portable telephone 50, infrared LEDs 31 and 33 are first covered by the hand and then infrared LED 32 is covered by the hand. In this case, the intensity of reflected light of infrared LEDs 31 and 33 increases first, and then the intensity of reflected light of infrared LED 32 increases, as shown in FIG. 22(*a*). If the intensity of reflected light of infrared LEDs 31 to 33 changes in the manner as shown in FIG. 22(*a*), MCU 36 determines that the user's hand moved laterally and, by way of example, scrolls the images on touch panel 51 to the lateral direction.

If the user of portable telephone 50 moves his/her hand in the Y direction of FIG. 19 on the surface of portable telephone 50, infrared LEDs 31 and 32 are first covered by the hand and then infrared LED 33 is covered by the hand. In this case, the intensity of reflected light of infrared LEDs 31 and 32 increases first, and then the intensity of reflected light of infrared LED 33 increases, as shown in FIG. 22(*b*). If the intensity of reflected light of infrared LEDs 31 to 33 changes in the manner as shown in FIG. 22(*b*), MCU 36 determines that the user's hand moved longitudinally and, by way of example, scrolls the images on touch panel 51 to the longitudinal direction.

As described above, by the present embodiment, movement of a reflecting object can be detected in contactless manner without using any motion sensor. Since motion sensor is not used, it is possible to reduce the size, to reduce the cost and to simplify the structure of the apparatus. Further, different from a portable telephone mounting a motion sensor, it is unnecessary to move portable telephone 5 itself. Therefore, it is unlikely that portable telephone 50 bumps against something and is broken while it is moved.

The embodiments as have been described here are mere examples and should not be interpreted as restrictive. The scope of the present invention is determined by each of the claims with appropriate consideration of the written description of the embodiments and embraces modifications within the meaning of, and equivalent to, the languages in the claims.

REFERENCE SIGNS LIST

1 semiconductor device, 1*a*, 54 printed circuit boards, 1*b* transparent resin, 2 proximity sensor, 3, 15 control circuits, 4 pulse generator, 5 driver, 6 infrared sensor, 7, 12 amplifiers, 8, 14 A/D converters, 9 linear/logarithmic converter, 10 ambient light sensor, 11 visible light sensor, 13, 40 capacitors, 20 data register, 21 oscillator, 22 timing controller, 23 signal output circuit, 24 signal input/output circuit, 25 power-on-reset circuit, 34 reflecting object, 35 visible light source, 37-39 resistor elements, 50 portable telephone, 51 touch panel, 52 speaker, 53 microphone, 54 spacer, 56 transparent plate, 57 back light, T1-T3 driving terminals, T4 signal output terminal, T5 clock input terminal, T6 serial data input/output terminal, T7 power supply terminal, T8, T9 ground terminal, T10 test terminal, α infrared light, β visible light

The invention claimed is:

1. A semiconductor device, comprising:
   first to N-th (N is an integer not smaller than 2) driving terminals connected to first to N-th infrared emitting units, respectively;
   a driving unit driving said first to N-th infrared emitting units through said first to N-th driving terminals to cause light emission from said first to N-th infrared emitting units at mutually different timings;
   a first light receiving unit receiving infrared light emitted from said first to N-th infrared emitting units and reflected by a reflecting object, and generating a photo-electric current of a level corresponding to intensity of the received infrared light;
   an operation control unit generating first to N-th pieces of infrared light information indicating intensity of infrared light emitted from said first to N-th infrared emitting units respectively and reflected by said reflecting object, based on the photo-electric current generated by said first light receiving unit; and
   an output terminal for outputting said first to N-th pieces of infrared light information to an outside,
   wherein said operation control unit includes a first register for storing pieces of information related to setting of first to N-th driving currents; and
   wherein said driving unit supplies the first to N-th driving currents to said first to N-th infrared emitting units based on said pieces of information stored in said first register to cause light emission by said first to N-th infrared emitting units, respectively.

2. The semiconductor device according to claim 1, wherein said first to N-th driving currents can be set individually.

3. The semiconductor device according to claim 1, wherein said operation control unit controls said driving unit.

4. The semiconductor device according to claim 1, wherein said operation control unit removes steady component from the photo-electric current generated at said first light receiving unit, and generates said first to N-th pieces of infrared light information based on the photo-electric current with said steady component removed.

5. The semiconductor device according to claim 1, wherein said operation control unit operates in accordance with a control signal;
   said device comprising
   an input terminal for applying said control signal from the outside to said operation control unit.

6. The semiconductor device according to claim 5, wherein said operation control unit includes a second register for storing said first to N-th pieces of infrared light information and said control signal.

7. The semiconductor device according to claim 1, further comprising:
   a second light receiving unit generating a photo-electric current of a level corresponding to intensity of incident visible light; wherein
   said operation control unit generates a piece of visible light information representing intensity of visible light entering said second light receiving unit, based on the photo-electric current generated at said second light receiving unit, and outputs the generated piece of visible light information to the outside through said output terminal.

8. The semiconductor device according to claim 1, further comprising:
a power supply terminal for supplying a power supply voltage from the outside to said driving unit and said operation control unit; and
a ground terminal for supplying a ground voltage from the outside to said driving unit and said operation control unit.

9. An electronic apparatus, comprising:
the semiconductor device according to claim 1; and
a detecting unit detecting a movement of said reflecting object based on said first to N-th pieces of infrared information from said semiconductor device.

10. The semiconductor device according to claim 1, wherein said operation control unit including:
an amplifier amplifying only a pulse component of the photo-electric current generated by said first light receiving unit and outputting an analog voltage of a level corresponding to the light intensity of infrared light incident on said first light receiving unit;
an A/D converter converting the analog voltage output from said amplifier to a digital signal; and
a linear/logarithmic converter calculating a log of the numerical value of the digital signal generated by said A/D converter and outputting a digital signal representing the calculated log.

11. A semiconductor device, comprising:
first to N-th (N is an integer not smaller than 2) driving terminals connected to first to Nth infrared emitting units, respectively;
a driving unit driving said first to N-th infrared emitting units through said first to N-th driving terminals to cause light emission from said first to N-th infrared emitting units at mutually different timings;
a first light receiving unit receiving infrared light emitted from said first to N-th infrared emitting units and reflected by a reflecting object, and generating a photo-electric current of a level corresponding to intensity of the received infrared light;
an operation control unit generating first to N-th pieces of infrared light information indicating intensity of infrared light emitted from said first to N-th infrared emitting units respectively and reflected by said reflecting object, based on the photo-electric current generated by said first light receiving unit; and
an output terminal for outputting said first to N-th pieces of infrared light information to an outside,
said operation control unit including:
an amplifier amplifying only a pulse component of the photo-electric current generated by said first light receiving unit and outputting an analog voltage of a level corresponding to the light intensity of infrared light incident on said first light receiving unit;
an A/D converter converting the analog voltage output from said amplifier to a digital signal; and
a linear/logarithmic converter calculating a log of the numerical value of the digital signal generated by said A/D converter and outputting a digital signal representing the calculated log.

12. The semiconductor device according to claim 11, wherein said driving unit supplies first to N-th driving currents to said first to N-th infrared emitting units to cause light emission by said first to N-th infrared emitting units, respectively; and
wherein said first to N-th driving currents can be set individually.

13. The semiconductor device according to claim 11, wherein said operation control unit controls said driving unit.

14. The semiconductor device according to claim 11, wherein said operation control unit removes steady component from the photo-electric current generated at said first light receiving unit, and generates said first to N-th pieces of infrared light information based on the photo-electric current with said steady component removed.

15. The semiconductor device according to claim 11, wherein said operation control unit operates in accordance with a control signal; and
wherein said device comprising an input terminal for applying said control signal from the outside to said operation control unit.

16. The semiconductor device according to claim 15, wherein said operation control unit includes a register for storing said first to N-th pieces of infrared light information and said control signal.

17. The semiconductor device according to claim 11, further comprising:
a second light receiving unit generating a photo-electric current of a level corresponding to intensity of incident visible light;
wherein said operation control unit generates a piece of visible light information representing intensity of visible light entering said second light receiving unit, based on the photo-electric current generated at said second light receiving unit, and outputs the generated piece of visible light information to the outside through said output terminal.

18. The semiconductor device according to claim 11, further comprising:
a power supply terminal for supplying a power supply voltage from the outside to said driving unit and said operation control unit; and
a ground terminal for supplying a ground voltage from the outside to said driving unit and said operation control unit.

19. An electronic apparatus, comprising:
the semiconductor device according to claim 11; and
a detecting unit detecting a movement of said reflecting object based on said first to N-th pieces of infrared information from said semiconductor device.

* * * * *